(12) United States Patent
Khayrullin et al.

(10) Patent No.: US 11,149,340 B2
(45) Date of Patent: Oct. 19, 2021

(54) METHOD OF DESIGNING AND FABRICATING A MICROLENS ARRAY

(71) Applicant: eMagin Corporation, Hopewell Junction, NY (US)

(72) Inventors: Ilyas I. Khayrullin, Hopewell Junction, NY (US); Amalkumar P. Ghosh, Hopewell Junction, NY (US); Ihor Wacyk, Hopewell Junction, NY (US); Evan Donoghue, Hopewell Junction, NY (US); Tariq Ali, Hopewell Junction, NY (US); Qi Wang, Hopewell Junction, NY (US); Kerry Tice, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 585 days.

(21) Appl. No.: 15/881,485

(22) Filed: Jan. 26, 2018

(65) Prior Publication Data
US 2018/0209030 A1 Jul. 26, 2018

Related U.S. Application Data

(60) Provisional application No. 62/450,788, filed on Jan. 26, 2017.

(51) Int. Cl.
*C23C 14/04* (2006.01)
*H01L 51/52* (2006.01)
*H01L 51/00* (2006.01)

(52) U.S. Cl.
CPC ........ *C23C 14/042* (2013.01); *H01L 51/0011* (2013.01); *H01L 51/5275* (2013.01)

(58) Field of Classification Search
CPC .............. C23C 14/042; H01L 51/0011; H01L 51/5275; G02B 3/0006
See application file for complete search history.

(56) References Cited

U.S. PATENT DOCUMENTS

| | | | | |
|---|---|---|---|---|
| 4,776,868 A | * | 10/1988 | Trotter, Jr. ............. | B29C 41/02 264/1.1 |
| 2015/0041793 A1 | * | 2/2015 | Chan ...................... | H01L 51/56 257/40 |
| 2017/0242160 A1 | * | 8/2017 | Zhang ................. | G02B 3/0012 |

* cited by examiner

*Primary Examiner* — Elizabeth A Burkhart
(74) *Attorney, Agent, or Firm* — Kaplan Breyer Schwarz, LLP

(57) ABSTRACT

In a method for designing and fabricating a micro-lens array, a design is finalized by varying certain features of a shadow mask, varying a distance between a source of lens-forming material and the shadow mask, and varying other parameters until the features and distances result in the formation of a micro-lens having desired shape, etc. A shadow mask in accordance with the design is then fabricated and is appropriately positioned with respect to a micro-display and a source of lens-forming material. A plume of lens-forming material is then generated under reduced pressure and which propagates toward the shadow mask, directly patterning the micro-lenses on sub-pixels of the micro-display.

9 Claims, 6 Drawing Sheets

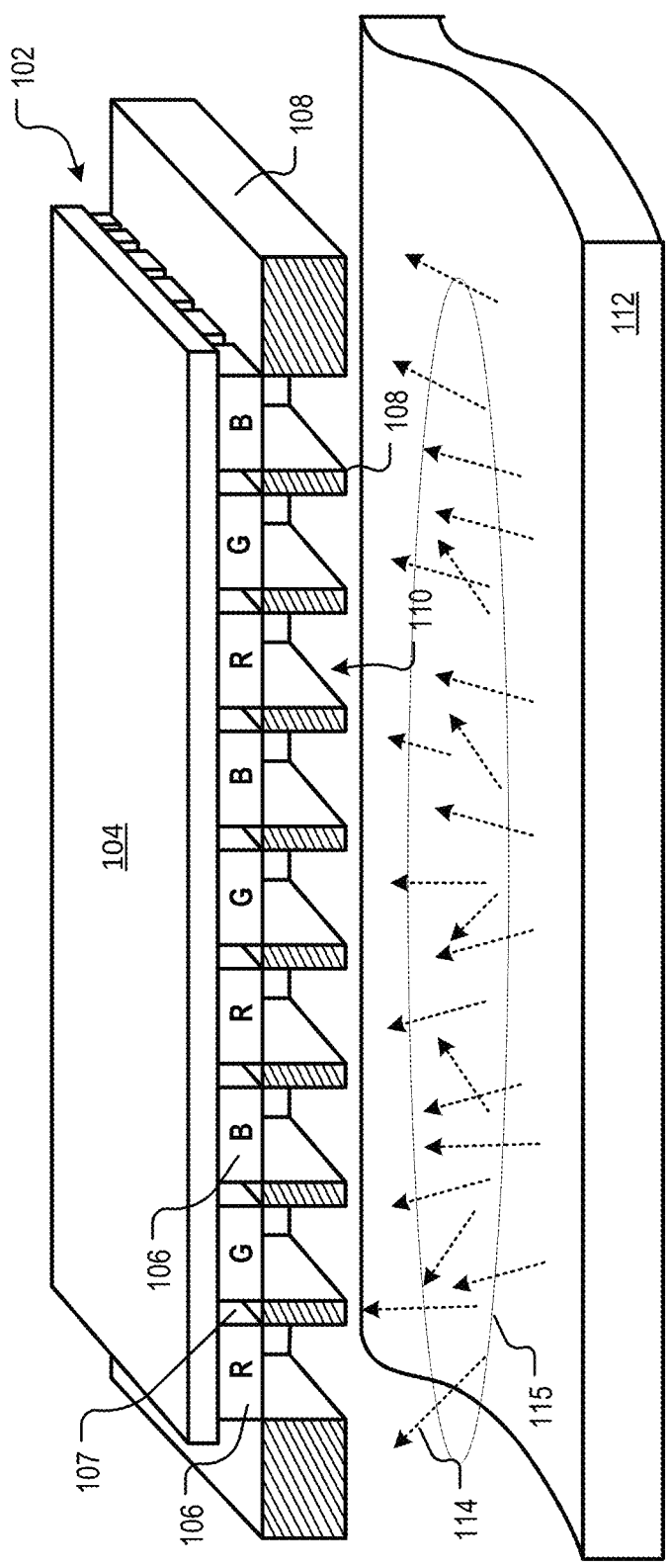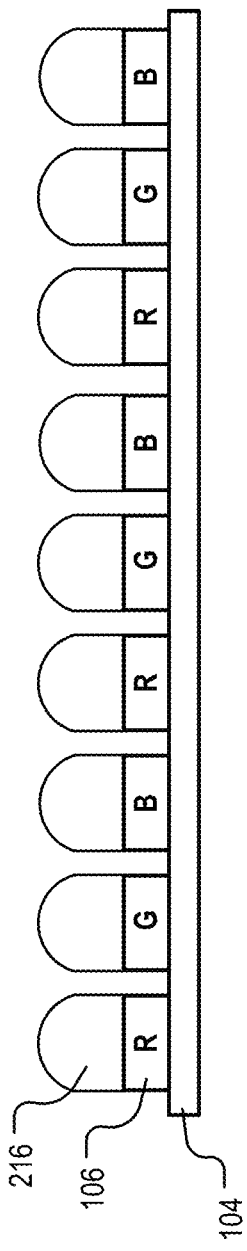

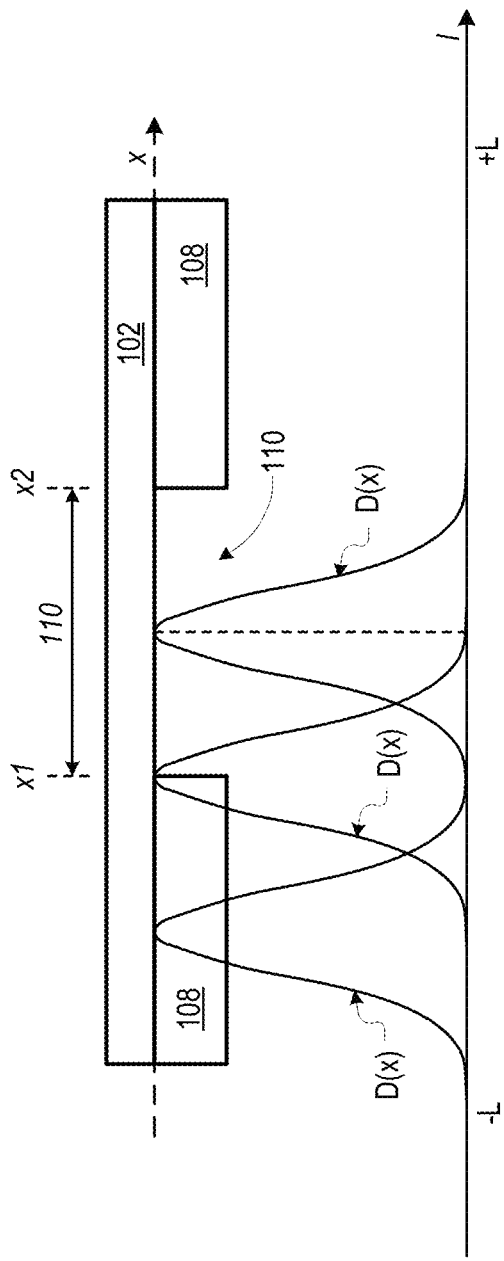

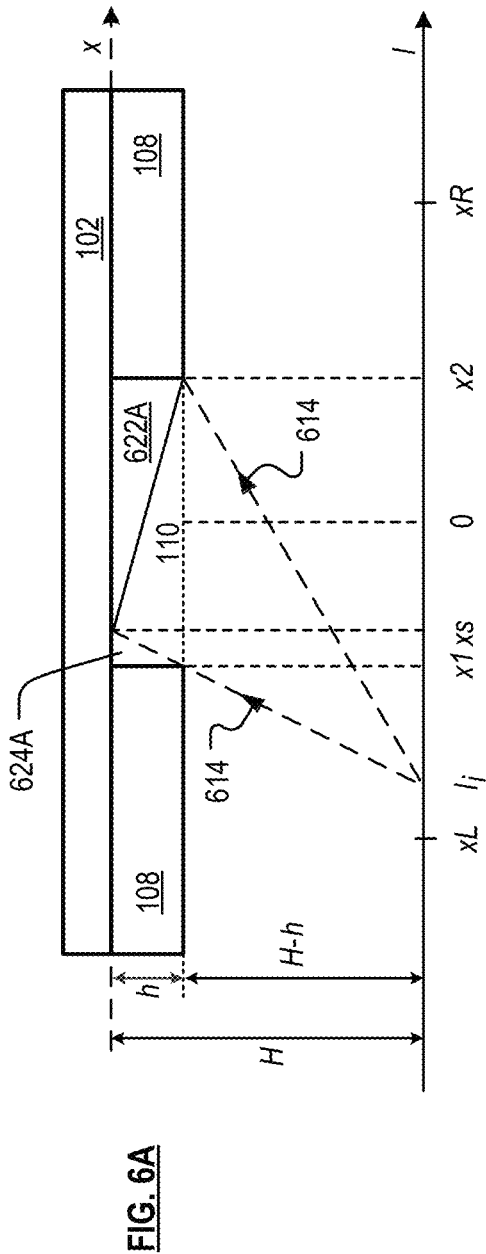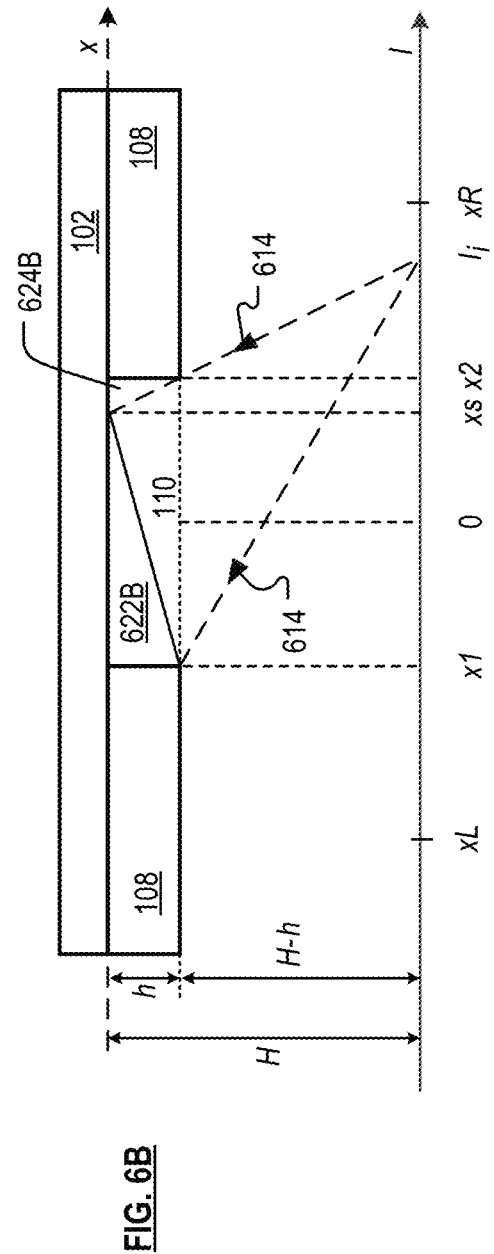
FIG. 6A
FIG. 6B

METHOD OF DESIGNING AND FABRICATING A MICROLENS ARRAY

STATEMENT OF RELATED CASES

This case claims priority to U.S. patent application Ser. No. 62/450,788 filed Jan. 26, 2017 and which is incorporated by reference herein.

FIELD OF THE INVENTION

The present invention relates to a method of designing and fabricating a microlens array.

BACKGROUND OF THE INVENTION

Currently, several methods are used to fabricate micro-lens arrays, including photolithography and resist processing (reflow) technique, sacrificial resist transfer in fused silica by reactive ion etching (RIE), replicating in polycarbonate and epoxy by embossing and casting techniques, and direct laser-beam writing in photoresist.

The processing temperatures required for these techniques are not compatible with organic light-emitting diode (OLED) organic materials. There are only two ways to implement micro-lens arrays in OLED materials. A first way is to prefabricate the array on a substrate, prior to depositing the OLED layers. This technique is suitable for down emitting structures. A second approach is to fabricate the micro-lens arrays on a separate transparent substrate and adhere same to the OLED layers using adhesives.

The second technique can be used with top emitting OLEDs. The ability to use a micro-lens array formed on a separate substrate depends on the subpixel dimensions and the ability to align individual lenses with OLED display subpixels. For large size displays, such alignment does not create any problem. However, it is very problematic to align a micro-lens array to a micro-display wherein the size of the subpixels is only a few microns.

SUMMARY OF THE INVENTION

Embodiments of the present invention provide a way to design and fabricate a micro-lens array without some of the drawbacks of the prior art.

In accordance with an illustrative embodiment, a micro-lens array is directly patterned using a vacuum-deposition technique in conjunction with a high-resolution shadow mask. Methods in accordance with the present teachings enable fabrication of a micro-lens array with individual lenses formed directly on top of the subpixels of an OLED micro-display, wherein the subpixels have dimensions as small as about 2-3 microns. As used herein, the term "micro-display" means a display in which the sub-pixel dimensions (i.e., length and width of rectangular shape sub-pixel or diameter of circular sub-pixel) are less than about 25 microns, typically less than about 15 microns, and more typically less than or equal to 10 to microns. The term "micro-lens" and inflected forms has the same meaning; that is, a lens having a foot-print with dimensions less than about 25 microns, typically less than about 15 microns, and more typically less than or equal to about 10 microns.

In accordance with the illustrative embodiment, each individual lens is formed directly on top of a respective individual OLED subpixel using transparent organic or inorganic material having a refractive index suitable for creating a lens effect. The material is vacuum deposited through a high-resolution shadow mask having openings equal in size to the footprint of the subpixels of the micro-display. In some alternative embodiments, the transparent organic or inorganic material is deposited by various other techniques including, but not limited to, thermal evaporation from a heated source, e-beam evaporation, or any other deposition technique providing the deposition plume is spread in space.

Embodiments of the invention provide a way to fabricate a micro-lens (array) as well as to design the elements of the system, such as the shadow mask, that are required to fabricate the micro-lens. In other words, one skilled in the art will know how to design a micro-lens for a particular application. However, to be able to fabricate that micro-lens using the vacuum deposition method disclosed herein, an appropriate high-resolution shadow mask must be designed. There are other parameters pertaining to the system that will impact the fabrication of the micro-lens, including, for example, the distance between the source and sub-pixels on which the lens-forming material is being deposited.

In the illustrative embodiment, the design and configuration of the system is based on repeated simulations, wherein input parameters, such as shadow-mask thickness and source to sub-pixel distance is varied until those parameters provide a desired lens design.

In a method in accordance with the invention, a shadow mask having a plurality of apertures is provided and positioned proximal to and aligned with the sub-pixels of a micro-display; a source of transparent material suitable for forming the micro-lenses is provided and positioned proximal to the shadow mask; and the micro-lenses are directly patterned on the sub-pixels by exposing the shadow mask to a plume of the transparent material generated by the source under reduced pressure and suitable for forming micro-lenses of a pre-determined shape.

In some embodiments, a system in accordance with the invention comprises a micro-display having a plurality of sub-pixels; a shadow mask having a plurality of apertures, wherein the shadow mask is disposed adjacent to the sub-pixels, wherein the apertures align with the sub-pixels, and wherein the apertures have dimensions that are the same as the dimensions of a footprint of the sub-pixels; and a source of a transparent material suitable for forming the micro-lenses, wherein, under reduced pressure, the source generates a plume comprising atoms of the transparent material that propagates towards the shadow mask and the sub-pixels of the micro-display.

BRIEF DESCRIPTION OF THE DRAWINGS

FIG. 1 depicts an arrangement and method in accordance with the present teachings wherein a shadow mask is positioned in front of the sub-pixels of a OLED micro-display, wherein the source generates a plume of material that deposits within the openings of the shadow mask to the form the micro-lens array.

FIG. 2 depicts the micro-lens array, as formed on the sub-pixels of the micro-display, via the arrangement and method depicted in FIG. 1.

FIG. 5 depicts, for a series of point-source locations, a series of thickness functions, each function representative of the manner in which material from an evaporation source at a particular location deposits on a surface.

FIG. 6A depicts, for a first location of the source on one side of an opening of a shadow mask, a material deposition zone within the opening.

FIG. 6B depicts, for a second location of the source on a second side of an opening of a shadow mask, a material deposition zone within the opening.

FIG. 7 depicts a micro-lens that is formed from material deposited through an opening of a shadow mask in accordance with the present teachings.

DETAILED DESCRIPTION

Figure 3:
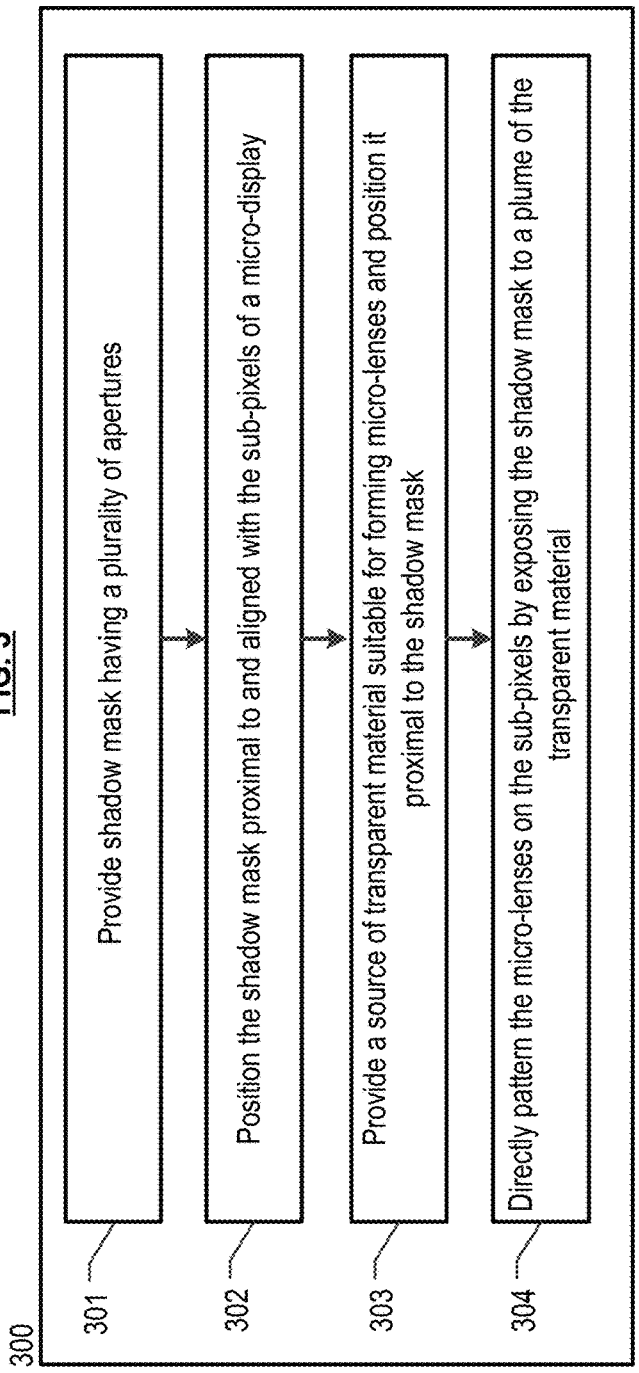
FIG. 3 depicts a flow diagram of a method for fabricating a micro-lens array in accordance with the illustrative embodiment of the invention.

Embodiments of the invention use a shadow-mask to deposit the material that forms the micro-lens. Known in the art, shadow-mask-based deposition is a process by which a material is deposited on the surface of a substrate such that the deposited material is patterned as desired during the deposition process itself. That is, there is not post-deposition patterning operation. This is referred to herein as "directly patterning."

In a typical shadow-mask deposition process, the desired material is vaporized at a source that is located some distance from a substrate, etc. As the vaporized atoms of the material travel toward the substrate, they must pass through a shadow mask that is positioned in front of and very close to the substrate surface. The shadow mask contains openings (i.e., apertures) whose arrangement matches that of the desired pattern for the material on the substrate. As a result, the vaporized atoms pass only through the apertures to deposit on the substrate surface.

Although shadow-mask-based deposition is conventional, the manner in which it is used in conjunction with the invention is not.

Turning now to a discussion of embodiments of the invention, FIG. 1 depicts an arrangement by which micro-lenses are formed on each of the sub-pixels 106 in micro-display 102. The arrangement is disposed in a vacuum chamber, not depicted, which can be a conventional pressure vessel suitable for providing a low-pressure atmosphere.

The micro-display comprises substrate 104 and a 2D array of sub-pixels 106. The sub-pixels are capable of emitting light in one of three colors: red, R, green, G, or blue B. Each sub-pixel is quite small, typically having a footprint of 2-3 microns on a side. Sub-pixels 106 are separated from one another by gap 107. The term "sub-pixel" is used because (at least) three of such sub-pixels—one R, one G, and one B—collectively form a "pixel," the basic light-emitting unit capable of producing all colors based on fractional contributions from the red, green, and blue-emitting sub-pixels.

Shadow mask 108 is placed on the sub-pixel side of the micro-display 102. In the embodiment depicted in FIG. 1, there is no gap between shadow mask 108 and sub-pixels 106. In some other embodiments, there is a slight gap, up to about 10 microns, between shadow mask 108 and sub-pixels 106. The shadow mask includes a plurality of apertures 110, which are located to align with sub-pixels 106 and have a size that matches the footprint of the sub-pixels. Thus, if a sub-pixel has a rectangular footprint with a long side of 2.5 microns and a short side of 1.75 microns, the corresponding aperture 110 in the shadow mask will have the same dimensions.

As discussed in more detail below, the thickness of shadow mask 108 is a design variable; it impacts the profile of a micro-lens formed in accordance with the method. For embodiments in which micro-lenses are being formed on a micro-display having sub-pixels with dimensions of about 2-3 microns on a side, the thickness of the shadow mask will typically, but not necessarily, be in the range about 1 to 20 microns.

At some distance from shadow mask 108 is source 112 of the transparent organic or inorganic material that will form the micro-lenses. Materials suitable for use for forming the micro-lenses must be easily evaporated, and, when atoms 114 thereof arrive on sub-pixels 106, they must result in an optically clean, dense form with an appropriate refractive index. Suitable materials include glasses and polymer/plastics.

Source 112 is a crucible for vaporizing the transparent material. When the material melts or sublimes within the low-pressure atmosphere of the vacuum chamber, source 112 ejects vaporized atoms 114 that propagate outward from the source in substantially ballistic fashion toward shadow mask 108. The vaporized atoms 114 ejected by source 112 collectively define fan-shaped vapor plume 115.

In the illustrative embodiment, wherein the micro-lenses are being formed on a micro display, source 112 will be orders of magnitude larger than apertures 110. For example, source 112 might have a size of about 2-10 inches, whereas apertures 110 have of about 2-3 microns.

Those skilled in the art will understand that vapor plume 115 includes vaporized atoms travelling in many different propagation directions, not simply in a direction orthogonal to source 112. As a result, a large fraction of the vaporized atoms that pass through apertures 110 in shadow mask 108 are travelling in directions that have a significant lateral component. The point at which each vaporized atom 114 is incident on a sub-pixel 106, or on the nascent micro-lens being formed thereon, is geometrically determined by, among any other factors, the thickness of shadow mask 108, the vaporized atom's propagation angle and location of departure respect to an aperture in the shadow mask 108 and its distance therefrom. These parameters will affect the shape/profile of micro-lens being formed, as discussed further below.

FIG. 2 depicts individual micro-lens 216 formed on sub-pixels 106 of the micro-display. This figure depicts a side-view; it is to be understood that, based on the arrangement depicted in FIG. 1, a 2D-array of micro-lenses results.

FIG. 3 depicts method 300 for fabricating a micro-lens array in accordance with the present teachings.

In accordance with operation 301, a shadow mask having a plurality of apertures is provided. The shadow mask has features that are specifically adapted and pre-determined to result in the fabrication of micro-lenses having a specific size and shape. Such a shadow mask is designed based on an approach discussed below in conjunction with FIGS. 4, 5, 6A, 6B, 7, and 8.

Per operation 302, the shadow mask is positioned in front of the micro-display such (i) that the apertures in the shadow mask align with the location of the sub-pixels of the micro-display, and (ii) it is at an appropriate distance (which might be zero) from the micro-display.

Operation 303 recites providing a source of transparent material suitable for forming micro-lenses and positioning it proximal to the shadow mask. The source is positioned at a specific distance from the shadow mask and micro-display.

In operation 304, micro-lenses are directly patterned on the sub-pixels by exposing the shadow mask and micro-display to a plume of vaporized atoms formed under reduced pressure (i.e., partial vacuum). The atoms accumulate on the sub-pixels forming the micro-lenses. Based on the design of the shadow mask and appropriate positioning, as discussed above, micro-lenses are directly patterned (no post processing to shape the micro-lenses) on the sub-pixels.

Micro-lens design, and considerations on which it is based, are now described in conjunction with FIGS. 4, 5, 6A, 6B, 7, and 8.

Figure 4:
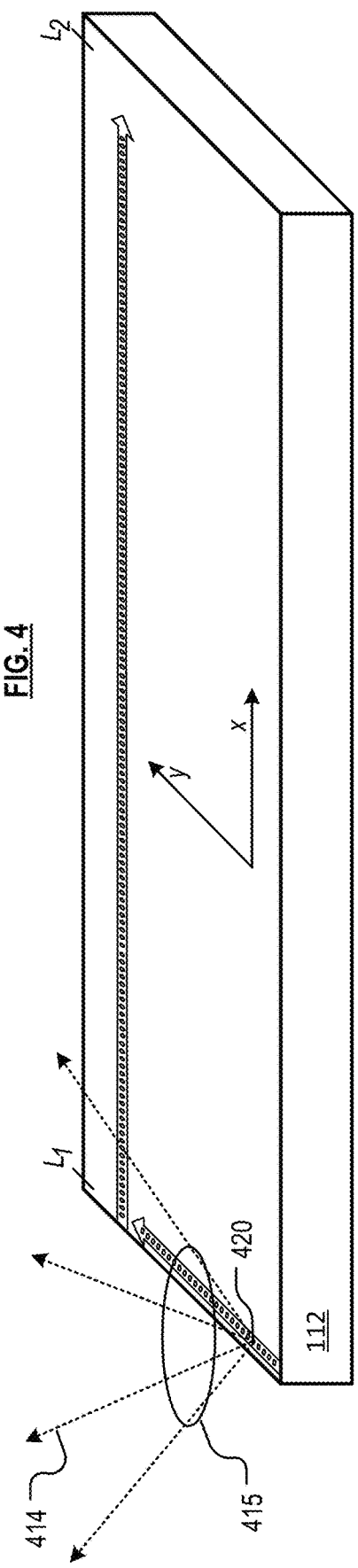
FIG. 4 depicts a technique wherein the source of FIG. 1 is considered to be a plurality of point-sources.

FIG. 4 depicts source 112, and illustrates the approach that the inventors have taken with respect to the micro-lens design. For the purpose of calculating the resulting film thickness of the deposition technique described above, source 112 can be considered to a point source moving in the x-direction and the y direction (or a plurality of point sources extending in the y-direction that move, sequentially, along the x-direction, or visa-versa).

For example, FIG. 4 depicts the conceptual sequential movement of point source 420 in the x-direction and y-direction across source 112. At each location of point source 420, plume 415 of vaporized atoms 414 propagates towards the shadow mask and those atoms passing through the apertures in the shadow mask will deposit at some of the sub-pixel sites. For each location of point source 420, a calculation is performed to estimate at which sub-pixels atoms are deposited and the profile of the deposition. The contribution of deposited atoms from every location of the point source across the source is summed, yielding an array of fully formed micro-lenses.

To perform the calculations referenced above, some relation must be established that defines the manner in which evaporated material in the plume deposits on the surface. Referring now to FIG. 5, high-resolution shadow mask 108 with aperture 110 equal to the OLED micro-display sub-pixel footprint is in contact (or nearly in contact) with substrate 102. It is assumed that the evaporated plume is deposited on a surface of micro-display 102 in such manner that the thickness of the deposited film can be expressed by some mathematical function D(x), where x is the distance on the wafer along some axis x. The series of peaks shown in FIG. 5 represent the function D(x) for an evaporation point source (see FIG. 4) traveling from left (−L) to right (+L) along axis I. For simplicity, only movement along x axis is shown in FIG. 5 and the figures that follow.

It was determined that a modified Lorentz distribution provides an acceptable approximation of the manner in which the material deposits. The determination was made by obtaining actual measurements of deposited material as a function of position and comparing those measurements to what would be predicted via various distributions (e.g., Gaussian, Lorentz, etc.).

Shadow mask 108 has a thickness, and that affects the manner in which atoms are deposited. This phenomenon is illustrated in FIGS. 6A and 6B. These figures depict shadow mask 108 having thickness h abutting micro-display 102. The size of aperture 110 is the distance between x1 (the left edge of the aperture) and x2 (the right edge of the aperture). The mid-point of the aperture is at 0. The distance between the "point source," which aligns with axis I, and the surface of micro-display 102 (i.e., the surface of the sub-pixels) is H. The distance between the point source and the plane in which aperture 110 resides is therefore H−h. It is assumed the deposited material travels from the source to the micro-display via a "line-of-sight" principle.

As depicted in FIG. 6A, for a (point) source depicted at location $l_i$, which is an arbitrary distance to the left of x1, the extreme left edge of aperture 110 and thickness h of the shadow mask (as well as any gap between the mask and the micro-display) results in shadowed area 624A. No material will deposit in the shadowed area; region 622A represents the region in which material will deposit for a point source located at the specified position.

In FIG. 6B, for a (point) source depicted at location $l_i$, which is an arbitrary distance to the right of x2, the extreme right edge of aperture 110 and thickness h of the shadow mask (as well as any gap between the mask and the micro-display) results in shadowed area 624B. No material will deposit in the shadowed area; region 622B represents the region in which material will deposit for a point source located at the specified position.

For the configuration shown in FIG. 6A; that is, for the case $l_i < x1$, the shadowing distance xs can be expressed via expression [1]:

$$xs = H \times \frac{x1 - l}{H - h} + l = A \times (x1 - l) + l \qquad [1]$$

For the configuration shown in FIG. 6B; that is, for the case $l_i > x2$, the shadowing distance xs can be expressed via expression [2]:

$$xs = l - H \times \frac{l - x2}{H - h} = l - A \times (l - x2) = A \times (x2 - l) + l \qquad [2]$$

The variables appearing in expressions [1] and [2] are as defined above in FIGS. 6A and 6B. The parameter A is a constant equal to H/(H−h), defining a deposited material thickness distribution, which is originated from a single point at location l. In the embodiments disclosed herein, constant A is fixed at the value 0.00015. However, this constant can have a different value, as a function of the particular source and mask-wafer configuration.

As the point source travels from extreme left location −L to extreme right location +L (see FIG. 5), the deposited material forms a film with the thickness D(x), which is the sum of thicknesses formed from all source locations $l_i$, per expression [3]:

$$D(x) = \sum_{l=-L}^{l=L} D(x, l) \qquad [3]$$

where the thickness distribution function D(x,l), which is established empirically by measuring actual film thickness and subsequent fitting as previously discussed, satisfies conditions shown in expression [4]:

$$D(x, l) = \begin{cases} \frac{H}{[1 + (a \times (x - l))^2]}, & \text{if } (x1 \le l \le x2) \text{ or } (l < x1 \text{ and } x \ge xs) \text{ or } (l > x2 \text{ and } x \le xs) \\ 0, & \text{else} \end{cases} \qquad [4]$$

FIG. 7 depicts formed micro-lens 216. Its shape is constrained by the shadowing effect and the fact that material is being deposited from different angles. The shadowing effect is dependent on shadow-mask thickness, the travel distance between the source and micro-display, and the propagation angle of atoms of material.

Figure 8:
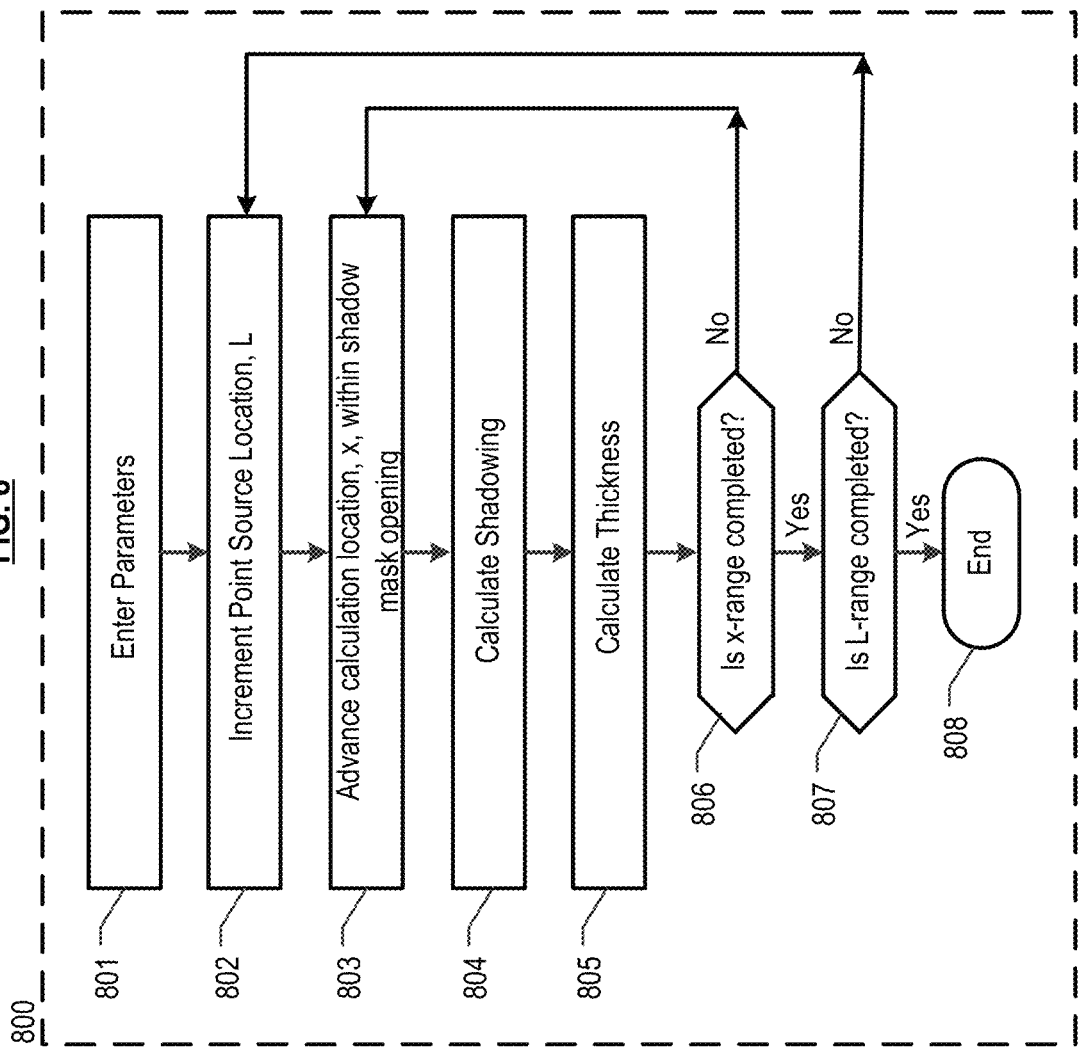
FIG. 8 depicts, for a microlens fabricated in accordance with the present teachings, a method for designing the microlens.

FIG. 8 depicts method 800 for designing a micro-lens by vacuum depositing material through a high-resolution shadow mask that is aligned to the sub-pixels of an OLED micro-display.

In operation 801, control variables are defined. Control variables, which should have uniform units, such as microns, include:
- H: distance between source and sub-pixel, per FIGS. 6A/6B;
- h: mask thickness, per FIGS. 6A/6B;
- G: mask-to-sub-pixel gap, if any;
- L1: point source scan start, per FIG. 4;
- L2: point source scan end; per FIG. 4;
- x1: left edge of sub-pixel, per FIGS. 6A/6B;
- x2: right edge of sub-pixel, per FIGS. 6A/6B;
- xL: left-most position for which deposited thickness is calculated (beginning to the left of x1), see FIGS. 6A/6B;
- xR: right-most position for which deposited thickness is calculated (ending to the right of x2), see FIGS. 6A/6B;
- x-Step: increment size for advancement of x (calculation location);
- L-Step: increment size for advancement of point source;
- T: desired thickness for micro-lens.

Operation 802 positions the point-source location (i.e., where atoms leave the source) and operation 803 increments the position in the x-direction at which the thickness calculation is performed. For the incremented point-location, the shadowing is calculated in operation 804 and thickness of the nascent micro-lens is calculated at operation 805. The shadowing calculation performed in operation 804 is based on expressions [1] and [2]. The thickness calculation performed in operation 805 is based on expression [3], which is based on the thickness distribution function D(x,l), as given in expression [4].

The loop created between query 806 and operation 803 causes operations 804 and 805 to be performed between the left-most (start) position xL to the right-most (end) position xR (see FIGS. 6A/6B), as incremented by the defined increment size. After the loop between operations 803 to 806 is performed for every x between xL->xR, processing passes to operation 807. Assuming the L-range (L$_1$->L$_2$) is not completed, the point source location is incremented by the defined increment size at operation 802. The loop between operation 803 to 806 is again performed for every x between xL->xR, based on the defined increment, and then L is again incremented per the defined increment. The loop defined between query 807 and operation 802 is performed for every L between the left-most (start) position L1 and the right-most (end) position L2 (see FIG. 4).

Typical values, in microns (except for the design lens thickness, which is given in angstroms), for input parameters for a micro-lens design for sub-pixel have a dimension of 3 microns across are provided in Table 1, below:

TABLE 1

| | |
|---|---|
| H | 50,000 |
| h | 1 |
| G | 5 |
| L1 | −5000 |

TABLE 1-continued

| | |
|---|---|
| L2 | 5000 |
| x1 | −1.5 |
| x2 | 1.5 |
| xL | −5 |
| xR | 5 |
| x-Step | 0.05 |
| L-Step | 10 |
| T | 250 |

It is notable that method 800 does not explicitly process in the "y" direction (e.g., see FIG. 4). In order to obtain a 3D representation of the micro-lens, method 800 is performed for the "x" direction, as described above, and then the "y" direction. To perform the method in the "y" direction, different dimensions are input in operation 801 as appropriate. This yield two sets of data: (1) thickness vs distance for the x-direction and (2) thickness vs distance for the y-direction. The total thickness of the micro-lens is then calculated as the sum of the contributions for the two directions. Alternatively, in conjunction with this disclosure, one skilled in the art will be able to modify method 800 with addition of processing loops to address both the "x" and "y" directions. Simply stated, thickness profiles are calculated for the "x" and "y" dimensions of a sub-pixel and the total thickness of the micro-lens is obtained.

Figure 9:
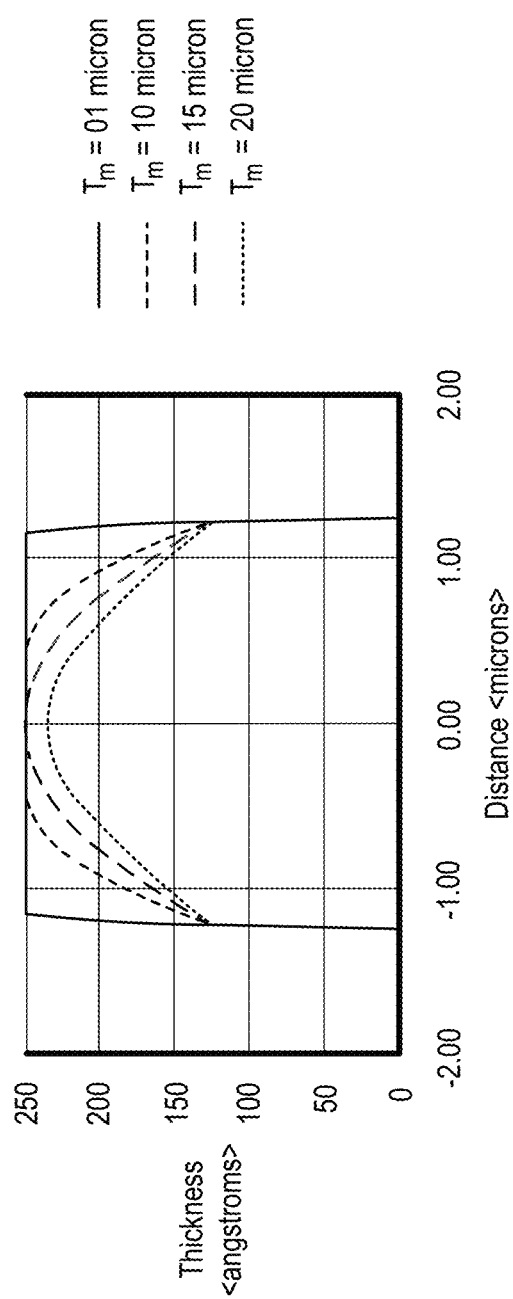
FIG. 9 depicts a thickness profile, calculated via the method of FIG. 8, for depositing material through a 2.5 micron opening in a high-resolution shadow mask, wherein shadow mask thickness is varied from 1 micron to 20 microns.

FIG. 9 depicts, based on the aforementioned method, the simulated profile of a micro-lens having a height of 250 angstroms for four different mask thicknesses: 1, 10, 15, and 20 microns through a 2.5 micron opening in a shadow mask.

Figure 10:
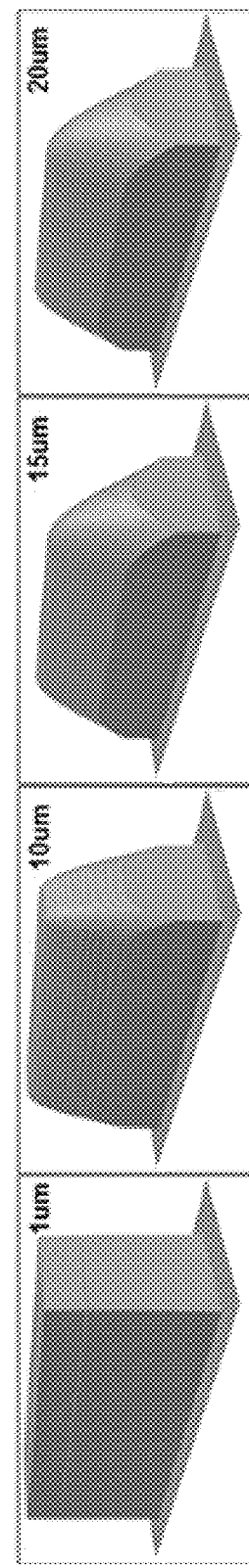
FIG. 10 depicts 3D images of the thickness profiles depicted in FIG. 9.

FIG. 10 depicts 3D images of the simulated thickness profile for material deposited through a 2.5 micron aperture in a high resolution shadow mask, wherein shadow mask thickness varies from 1 micron to 20 micron. These images illustrate how the deposited thickness profile responds to changes in shadow mask thickness. The curvature of the lens will depend on the shadow mask thickness and the opening tailored to the micro-display sub-pixel.

It is notable that in the depicted embodiments, apertures 110 in the shadow mask have a rectangular shape, which of course affects the shape of micro-lens formed thereby. For example, if it is desired to form a (hemi-) spherical lens, a circular aperture is used.

As used herein and in the appended claims, the terms "about" or "substantially," as terms of degree, mean within +/−15% of a stated number.

It is to be understood that the disclosure teaches just one example of the illustrative embodiment and that many variations of the invention can easily be devised by those skilled in the art after reading this disclosure and that the scope of the present invention is to be determined by the following claims.

What is claimed:

1. A method for forming micro-lenses on sub-pixels of a micro-display, the method comprising:
   providing a source of transparent material suitable for forming the micro-lenses;
   providing a shadow mask having a plurality of apertures, the shadow mask having a first thickness in a range of about 1 micron to about 20 microns and the apertures having a first shape;
   positioning the shadow mask between the source of transparent material and the sub-pixels of the micro-display, wherein:
   (a) the shadow mask is positioned a first distance from the sub-pixels of the micro-display;

(b) the source of transparent material is positioned at a second distance from the shadow mask;

(c) dimensions of the apertures are equal to dimensions of a footprint of each sub-pixel; and directly patterning the micro-lenses on the sub-pixels by exposing the shadow mask to a plume of the transparent material generated by the source under reduced pressure and suitable for forming the micro-lenses, wherein the micro-lenses have a pre-determined shape, wherein the predetermined shape is dependent on the first thickness, and wherein a footprint of each micro-lens is equal to the footprint of each sub-pixel, and a shape of the footprint of each micro-lens is dependent on the first shape of the apertures.

2. The method of claim 1 and further wherein the pre-determined shape of the micro-lenses is also dependent on the first distance.

3. The method of claim 1 and further wherein the pre-determined shape of the micro-lenses is also dependent on the second distance.

4. The method of claim 1 wherein designing a shadow mask further comprises determining a shadowing distance for the shadow mask, wherein the shadowing distance is based on (i) the first distance, (ii) a distance between the shadow mask and the source, (iii) a location of an edge of an aperture, and (iv) a location of a point source relative to the location of the edge, wherein the point source represents a division, for purposes of calculation, of the source into a plurality of discrete locations from which the transparent material is considered to be emitted.

5. The method of claim 4 wherein designing a shadow mask further comprises validating the design of the shadow mask by verifying, via simulation, that the shadow mask results in the pre-determined shape for the micro-lenses, wherein the predetermined shape is determined by calculating a thickness of material deposited on a sub-pixel for a plurality of the locations of the point source and summing the thicknesses calculated for all such locations.

6. The method of claim 5 further comprising fabricating the shadow mask once the design thereof is verified.

7. The method of claim 1 wherein the apertures have dimensions of length and width that are each in the range of about 2 to about 3 microns.

8. The method of claim 1 wherein the first distance is less than or equal to about 10 microns.

9. The method of claim 1 wherein each micro-lens has a height of about 250 angstroms and wherein the subpixels are OLEDs.

* * * * *